United States Patent [19]

Farassat et al.

[11] Patent Number: 4,925,083
[45] Date of Patent: May 15, 1990

[54] BALL BONDING METHOD AND APPARATUS FOR PERFORMING THE METHOD

[75] Inventors: Farhad Farassat, Munich; Walter Birgel, Feldkirchen, both of Fed. Rep. of Germany

[73] Assignee: Emhart Deutschland GmbH, Fed. Rep. of Germany

[21] Appl. No.: 272,780
[22] PCT Filed: Dec. 9, 1987
[86] PCT No.: PCT/EP87/00765
§ 371 Date: Oct. 5, 1988
§ 102(e) Date: Oct. 5, 1988
[87] PCT Pub. No.: WO88/05960
PCT Pub. Date: Aug. 11, 1988

[30] Foreign Application Priority Data

Feb. 6, 1987 [DE] Fed. Rep. of Germany ....... 3703694

[51] Int. Cl.$^5$ ............. B23K 20/00; B23K 31/00
[52] U.S. Cl. ................ 228/102; 228/179; 228/4.5; 228/9; 228/103
[58] Field of Search ........... 228/102, 103, 110, 111, 228/179, 1.1, 4.5, 9, 12; 219/56.21

[56] References Cited

U.S. PATENT DOCUMENTS

| | | | |
|---|---|---|---|
| 3,863,827 | 2/1975 | Foulke et al. | 228/1.1 |
| 3,941,486 | 3/1976 | Tyler | 228/4.5 |
| 4,109,846 | 8/1978 | Pennings et al. | 228/4.5 |
| 4,213,556 | 7/1980 | Persson et al. | 228/104 |
| 4,555,052 | 11/1985 | Kurtz et al. | 228/4.5 |
| 4,586,642 | 5/1986 | Driebelbis et al. | 228/4.5 |

FOREIGN PATENT DOCUMENTS 0011979 6/1980 European Pat. Off. ............ 228/4.5

*Primary Examiner*—Nicholas P. Godici
*Assistant Examiner*—Samuel M. Heinrich
*Attorney, Agent, or Firm*—Andrus, Sceales, Starke & Sawall

[57] ABSTRACT

A ball bonding method and apparatus is disclosed including gold wire bonding. The steps include positioning and lowering a bond capillary (10) with a bond wire (11) including a flame-scarfed bond wire ball (12) downwardly onto a first bonding pad (17). The bond wire ball (12) is welded by heating and applying a bonding pressure or ultrasonic, or both. The bond capillary (10) is raised and moved to form a loop (21), followed by the step of welding the bond wire (11) to a second bonding pad (16) using heating and applying pressure, ultrasonic or both. The bond capillary (10) is raised to a tail-length position (29) and the bond wire (11) is broken by a vertical pulling force created by closing a clamp (13) onto the wire and raising the clamp (13) engaging the bond wire (11). The end of the free bond wire is flame-scarfed to form a bond wire ball (12). For the flame-scarfing, the distance travelled by the wire clamp (13) until the bond wire (11) breaks is measured and the flame-scarfing lance (18) is accurately adjusted, or the free wire end after breakage is accurately adjusted.

5 Claims, 1 Drawing Sheet

BALL BONDING METHOD AND APPARATUS FOR PERFORMING THE METHOD

BACKGROUND OF THE INVENTION

In microelectronics, bonding generally refers to the interconnection of components by glueing or welding as distinguished from conventional soldering in which the connections are made by means of solder (mostly a tin-lead-alloy). A distinction is made between chip (die) bonding methods for mounting a component on a supporting substrate and wire bonding methods for connecting the component leads to the substrate or for connecting the contact pads of component and substrate by means of fine wires. The present invention deals with the last-mentioned method, in particular with ball bonding, as it is called. The various steps of ball bonding are as follows:

positioning and lowering the bond head or a bond capillary associated therewith and including a flame-scarfed bond ball from an upwardly retracted starting position to a first bonding location;
welding the bond wire ball by supply of heat, defined bonding pressure and/or ultrasonic assistance;
upwardly retracting the bond capillary;
loop formation;
welding the bond wire at a second bonding location by supply of heat, defined bonding pressure and/or ultrasonic assistance;
upwardly retracting the bond capillary to a predetermined tail-length position, breaking the bond wire by subjecting it to a pulling force by means of a clamp engaging the bond wire, and subsequent upward retraction of the bond capillary to the starting position; and
flame-scarfing the free end of the bond wire to form a bond wire ball;
etc.

In view of the progressively increasing miniaturization of components and thus of the bonding or contact pads the size of the ball must be correspondingly reduced so as to prevent short-circuits between adjacent bonding or contact pads. Moreover, there is a demand for the mentioned "mini-balls" to be accurately dimensioned. These two prerequisites cannot readily be satisfied with the described conventional method. This is due to the fact that with conventional ball bonding the following phenomena are not taken into account:

1. elongation of the often very thin gold wire up to 10%;
2. slippage between the bond wire and the clamp causing breakage thereof;
3. deformation of the bond wire, especially lateral deflection thereof, in the unloaded state after welding to the second bonding pad due to internal stresses.

Due to the fact that the specified phenomena are not taken into account, a highly undefined tail length and a correspondingly undefined ball size are obtained with conventional ball bonding.

SUMMARY OF THE INVENTION

Accordingly, the present invention is based on the object of providing a ball bonding method of the specified kind and an apparatus for performing said method, by means of which the ball size can be accurately controlled, especially also in case of so-called mini-balls.

The specified object is solved in a surprisingly simple way by a method and apparatus wherein a voltage is impressed between a clamp for raising the wire and the second pad to provide a measure that the clamp is raised to break the wire. In accordance with another feature of the invention, after the wire breaks, it is moved down to reference abutment, which may be a flame scarfing device, and then raised a set distance to establish a predetermined spacing from the flame-scarfing device.

In addition to solving the specified object, the methods according to the present invention additionally provide further information. When an electrical connection between the wire clamp and the bonding pad or lead frame cannot be made as soon as the wire clamp is in wire clamping position, there is no tail connection to the second bonding pad or the bond wire has already broken without the wire clamp becoming active. In this case the bonding apparatus is preferably deenergized, and the failure is investigated and eliminated whereupon the bonding apparatus is reset.

In the method including a predetermined lowering of the bond head, if contact between the free end of the bond wire and the flame-scarfing means still cannot be detected after the predetermined basis, the tail length is too short to form a sufficiently dimensioned ball. In this case also the bonding apparatus is preferably deenergized, the failure is investigated and eliminated, whereupon the bonding apparatus is reset.

Thus, the methods in accordance with the present invention permit additional failure signals which cannot be obtained when operating in accordance with the conventional methods.

Other features of the method including moving the clamp and wire in steps and counting the steps moved in breaking the wire. After the wire breaks, the counting of the steps is reset to zero.

BRIEF DESCRIPTION OF THE DRAWINGS

The method and apparatus according to the present invention is again explained in detail with reference to a basic diagram, in which.

DESCRIPTION OF THE ILLUSTRATED EMBODIMENT

Figure 1:
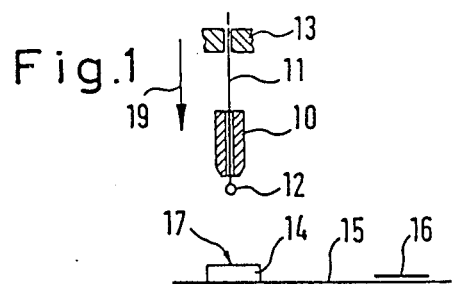
FIGS. 1 to 7 show apparatus and the basic sequence of the ball bonding method according to the invention.

The attached drawing shows a bond capillary 10, a gold bond wire 11 including a mini-ball 12 at the bottom free wire end, a wire clamp 13 engaging the bond wire 11, a component 14 with a first bonding pad 17, a lead frame 15, a second bonding pad 16 on the lead frame or substrate, respectively, and a flame-scarfing lance 18.

Starting from an upwardly retracted starting position of a bond head not illustrated in detail and including the bond capillary 10 with the flame-scarfed bond wire ball 12, the bond capillary is lowered onto a first bonding pad 17 formed on a component 14, as illustrated by the arrow 19 in FIG. 1. Lowering of the bond capillary 10 entails lowering of the ball 12 and thus corresponding lowering of the bond wire 11. Subsequently, the ball 12 is welded to the first bonding pad 17 on the component 14 by the supply of heat, a defined bonding pressure and/or ultrasonic assistance.

Figure 4:
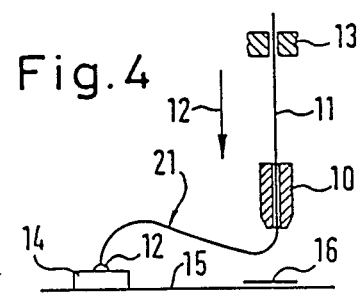
Figure 2:
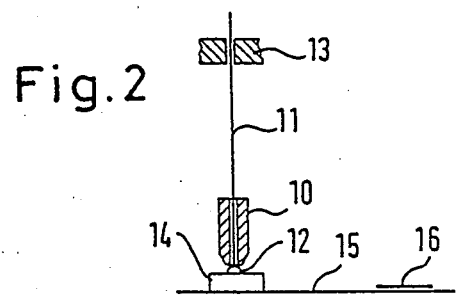
Figure 5:
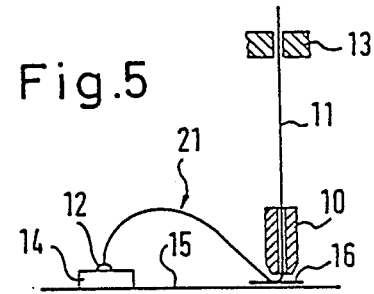
Figure 3:
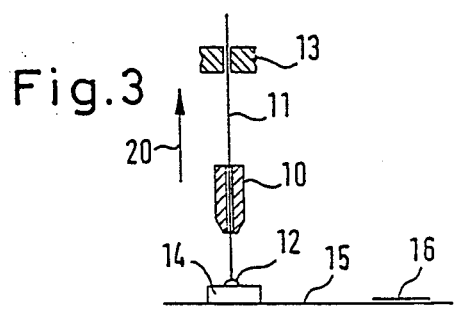

Then, the bond head or the bond capillary 10 is retracted upwardly (see arrow 20 in FIG. 3) and moved to a predetermined loop position shown in FIG. 4 whereby a so-called bond wire loop 21 is formed. In the loop position, the bond capillary is positioned above the second bonding pad 16. Then the bond capillary is again lowered (see arrow 22 in FIG. 4) from the loop position together with the bond wire 11. In the lowered position shown in FIG. 5 the bond wire 11 is then welded to the second bonding pad 16 again with the aid of heat supply, a defined bonding pressure and/or ultrasonic assistance.

Figure 6:
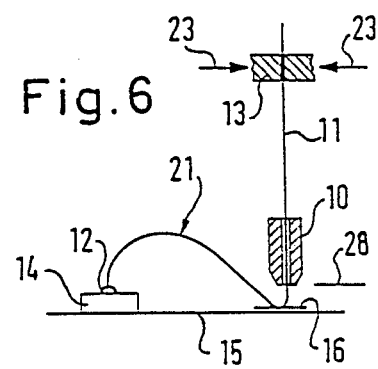
Figure 7:
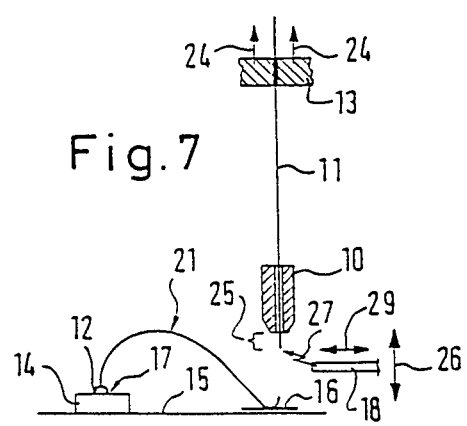

Then, the bond head or bond capillary 10 is moved to the tail-length position 28 illustrated in FIG. 6. Subsequently, the wire clamp 13 is activated and moved to the wire clamping position as indicated by the arrows 23 in FIG. 6. Thereafter a voltage is applied between the wire clamp and the second bonding pad 16, possibly via the lead frame 15. As soon as this voltage has been applied the wire clamp 13 is moved upwards, as indicated by the arrows 24 in FIG. 7, while a corresponding pulling force is exerted on the bond wire 11 until the latter breaks. Upon breakage of the bond wire 11 the electrical connection between wire clamp 13 and second bonding pad 16 is interrupted. The pulling or breaking movement of the wire clamp 13 is stopped. At the same time the distance travelled by the wire clamp 13 in the direction of the arrows 24 until breakage of the bond wire 11 is sensed. In this way it is possible to determine the actual tail length 25 (FIG. 7) or the exact position of the free bond wire end above the second bonding pad 16, so that it will be possible to position the means for flame-scarfing the free bond wire end to form a fresh ball 12, i.e. to position the flame-scarfing lance 18 opposite the free bond wire end or wire tip in such a way (see double-arrow 26 in FIG. 7) that the flame-scarfing lance 18 always has a predetermined distance from the bond wire tip. Then the flame-scarfing lance 18 is energized (flame-scarfing spark 27) so that the tail 25 is deformed to result in a fresh ball 12.

Subsequently, the wire clamp 13 is re-opened and lowered to the starting position illustrated in FIG. 1. A fresh bonding cycle of the described kind may then be started.

Preferably, the wire clamp 13 is driven by a stepping motor. The distance travelled by the wire clamp 13 until the bond wire 11 breaks is accordingly determined in steps (clocks). Preferably, up-and-down movement of the flame-scarfing lance 18 along the double-arrow 26 is likewise performed by means of a stepping motor, the counters of both stepping motors being coupled through a computing unit so that the desired allocation of the flame-scarfing lance 18 to the free wire tip can be made fully automatically.

As soon as the wire clamp 13 is again in the starting position illustrated in FIG. 1 the counter cooperating with the wire clamp 13 is reset to zero. The flame-scarfing lance 18, too, is returned to a zero position after flame-scarfing of the tail 25. As soon as said zero position has been reached, the counter cooperating with the drive means for the flame-scarfing lance 18 is also reset to zero. Both the wire clamp 13 and the flame-scarfing lance 18 are thus placed in the starting position from which the mutual positioning of free wire tip and flame-scarfing lance 18 is determined and controlled.

By means of the described method it is possible that the above-mentioned fault-causing phenomena or parameters such as elongation and wire deformation (lateral deflection in the unloaded state) are eliminated so that the ball can be dimensioned accurately.

The same result will be obtained when, following breakage of the bond wire 11, the upwardly retracted bond capillary 10 is lowered again until the free wire tip contacts either the flame-scarfing lance, which in the meantime has been returned or pivoted to the flame-scarfing position, or a corresponding abutment. Thereafter, the bond head need only be lifted until a predetermined spacing between the free wire tip and the flame-scarfing lance 18 has been reached. In this way it is likewise possible to permanently determine the exact size of the ball. With the lastmentioned method, the flame-scarfing lance 18 merely moves in the directions of the double-arrow 29 in FIG. 7. With the last-mentioned method, a conventional electrical (non-contact) sensor, a mechanical sensor or an ultrasonic sensor may be used as contact sensor.

It is also possible with the last-mentioned method to determine whether or not a sufficiently long tail 25 is present. If after a predetermined lowering of the bond head there is still no contact with the flame-scarfing lance 18, this will indicate that the tail length is too short for forming a sufficiently large ball 12.

It is an advantage of the first-mentioned method that premature breakage of the bond wire without the action of the wire clamp 13 can be determined if subsequent to closing of the wire clamp 13 an electrical connection between said clamp and the second bonding pad 16 cannot be made.

All of the features disclosed in the present papers are claimed as being essential for the invention to the extent to which they are novel over the prior art either individually or in combination.

We claim:

1. A ball bonding method including the working steps of:
   (a) positioning and lowering a bond capillary including a flame-scarfed bond wire ball from an upwardly retracted starting position onto a first bonding pad;
   (b) welding the bond wire ball by heating and applying a defined bonding pressure and/or ultrasonic assistance;
   (c) upward-retracting of the bond capillary;
   (d) forming a loop in the bond wire;
   (e) welding the bond wire in spaced relation to the bond wire ball to a second bonding pad by heating and applying a defined bonding pressure and/or ultrasonic assistance;
   (f) upward-retracting of the bond capillary to a predetermined tail-length position, clamping and pulling on said bond wire to break the bond wire; and subsequent upward-retracting of the bond capillary to said starting position; and
   (g) flame-scarfing the free bond wire end to form a fresh bond wire ball; and
   the improvement comprising the steps of
   (h) applying a voltage between said second bonding pad and said clamp exerting said pulling force on the bond wire as soon as the clamp is in the wire clamping position;
   (i) measuring the distance travelled by the clamp until breakage of the bond wire in accordance with interruption of the electrical connection between the second bonding pad and the clamp, and;
   (j) locating a flame-scarfing device spaced from the free bond wire end in accordance with distance travelled by the clamp and thereby spacing the flame-scarfing device a predetermined distance from the free bond wire end.

2. The method as claimed in claim 1 including moving said clamp which serves to break the bond wire welded to the second bonding pad in a step-wise sequence and counting the steps until the bond wire breaks.

3. The method as claimed in claim 2 including resetting of the counting of the steps to zero after the wire breaks.

4. A ball bonding method including
   (a) lowering a bond capillary including a wire having a flame-scarfed bond wire ball from an upwardly retracted starting position onto a first bonding pad; and
   (b) heating said ball and applying bonding pressure and/or ultrasonic force to the ball and pad to weld the ball to the pad; and
   (c) raising and moving the bond capillary and wire to form a loop aligned with a second bonding pad;
   (d) welding the bond wire to said second bonding pad including heating and applying bonding pressure and/or ultrasonic force;
   (e) upward-retracting of the bond capillary to a predetermined tail-length position, breaking of the bond wire by subjecting it to a pulling force by means of a clamp engaging the bond wire, and further upwardretraction to the starting position; and
   (f) flame-scarfing the free bond wire end to form a fresh bond wire ball;
   the improvement comprising the steps of
   (g) locating a flame-scarfing device in the flame-scarfing position prior to flame-scarfing of the free bond wire end; and
   (h) subsequent to said locating of said device lowering of the bond capillary until the free bond wire end contacts a reference element and then raising the bond capillary a predetermined distance to locate the free bond wire end in a predetermined spacing from the flame scarfing device.

5. The method as claimed in claim 4 including sensing the contacting of the free bond wire end.

* * * * *